United States Patent
Karuppiah et al.

(10) Patent No.: US 11,921,168 B2
(45) Date of Patent: Mar. 5, 2024

(54) CONNECTOR CONNECTION VERIFICATION SYSTEM

(71) Applicant: Dell Products L.P., Round Rock, TX (US)

(72) Inventors: Kannan Karuppiah, Fremont, CA (US); Shree Rathinasamy, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 435 days.

(21) Appl. No.: 17/221,068

(22) Filed: Apr. 2, 2021

(65) Prior Publication Data
US 2022/0317201 A1 Oct. 6, 2022

(51) Int. Cl.
| | |
|---|---|
| G06F 13/14 | (2006.01) |
| G01R 31/55 | (2020.01) |
| G01R 31/69 | (2020.01) |
| H01R 13/66 | (2006.01) |
| H01R 43/20 | (2006.01) |

(52) U.S. Cl.
CPC ............ *G01R 31/55* (2020.01); *G01R 31/69* (2020.01); *H01R 13/6683* (2013.01); *H01R 43/20* (2013.01)

(58) Field of Classification Search
CPC .... G01R 31/55; G01R 31/69; H01R 13/6683; H01R 43/20; H01R 13/641
See application file for complete search history.

(56) References Cited

U.S. PATENT DOCUMENTS

| | | | | |
|---|---|---|---|---|
| 2011/0237125 A1* | 9/2011 | Montena | ............... | G01R 31/343 439/578 |
| 2015/0002296 A1* | 1/2015 | Bell | ..................... | H01R 13/465 340/540 |
| 2015/0363339 A1* | 12/2015 | Huang | .................... | G06F 13/10 710/33 |

* cited by examiner

*Primary Examiner* — Henry Tsai
*Assistant Examiner* — Kim T Huynh
(74) *Attorney, Agent, or Firm* — Joseph Mencher

(57) ABSTRACT

A connector connection verification system includes a cable connector and a networking device. The networking device includes a port system defining a port and including a networking device connector, and at least one cable connector sensor device that is located adjacent the port. The cable connector sensor device(s) detects that the cable connector is inserted in the port defined by the port system while the cable connector does not mate with the networking device connector included in the port system and, in response, transmits an incorrect connection signal that indicates that the cable connector is incorrectly connected to the port system. A management interface provided on the networking device may receive the incorrect connection signal from the cable connector sensor device(s), and provide information that describes the cable connector and that indicates that the cable connector is incorrectly connected to the port system for display on a display device.

20 Claims, 11 Drawing Sheets

```
Os10# show inventory media
               System Inventory Media
Node/Slot/Port  Form-factor  Media              Serial No.  Qualified  Seated
1/1/1           SFP+         SFP+ 10BASE-SR                 true       YES
1/1/2           SFP+         SFP+ 10BASE-SR                 true       YES
1/1/3           SFP+         SFP+ 10BASE-SR                 true       YES
1/1/4           SFP+         SFP+ 10BASE-SR                 true       YES
1/1/5           SFP+         SFP+ 10BASE-SR                 true       YES
1/1/6           SFP+         SFP+ 10BASE-SR                 true       YES
1/1/7           SFP+         SFP+ 10BASE-SR                 true       YES
1/1/8           SFP+         SFP+ 10BASE-SR                 true       YES
1/1/9           SFP+         SFP+ 10BASE-SR                 true       YES
1/1/10          SFP+         SFP+ 10BASE-SR                 true       YES
...
1/1/49          SFP+         SFP+ 10BASE-SR     AQM151M     true       YES
1/1/50          SFP+         SFP+ 10BASE-SR     APD2WCM     true       YES
1/1/51                       CONNECTION ERROR                          NO
1/1/52                       CONNECTION ERROR                          NO
```

MANAGEMENT DEVICE 700

FIG. 7

CONNECTOR CONNECTION VERIFICATION SYSTEM

BACKGROUND

The present disclosure relates generally to information handling systems, and more particularly to verifying the connection of a connector with an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, networking devices (e.g., switch devices), are provided connections to other devices (e.g., server devices, storage systems, etc.) in order to allow for the transmission of data between the switch devices and those other devices. For example, switch devices may be connected to other devices via direct-attach cables (e.g., passive Direct Attach Copper (DAC) cables, active DAC cables, or Active Optical Cables (AOCs)), transceiver devices and corresponding cabling, and/or in other manners known in the art. However, the transceiver devices or direct-attach cable connectors on the direct-attach cables discussed above may be provided with various form-factors, and must be inserted in the port in a proper oriented and "seated" (or otherwise correctly connected to a port connector) in the port on the switch device in order to provide connectivity that allows a link to be established and utilized in transmitting data. However, switch devices do not include any ability to identify and affirmatively indicate when a direct-attach cable connector or transceiver device is inserted in but improperly connected to one of its ports, which can raise some issues.

For example, when a direct-attach cable connector or transceiver device is improperly connected to a port on a switch device (e.g., inserted "upside down" or not inserted fully into the port), the operating system provided on that switch device will fail to detect that direct-attach cable connector or transceiver device (e.g., due to it not being full mated with a port connector in the port), which often results in the user of the switch device contacting a switch device support system. In such situations, the switch device support system (which is typically remote from the switch device) will be unable to identify the improperly connected direct-attach cable connector or transceiver device via its remote access to the Command Line Interface (CLI) provided by the switch device, and detection of the improperly connected direct-attach cable connector or transceiver device will often require time-consuming troubleshooting steps that may ultimately require that the user of the switch device be physically co-located with the switch device in order to capture and send photos of the direct-attach cable connector/transceiver device and the switch device so that support staff can recognize the improper connection. Such issues can result in data loss, network traffic disruption, network downtime, support calls, time-consuming troubleshooting operations by network engineers whose time would be better spent on other issues, direct-attach cable connector or transceiver device damage (i.e., when forced into the port in the wrong orientation), discarded direct-attach cables or transceiver devices (based on the assumption they are defective rather than improperly connected), and in some cases, the purchasing of new direct-attach cables or transceiver devices that are not needed.

Accordingly, it would be desirable to provide a connector connection verification system that addresses the issues discussed above.

SUMMARY

According to one embodiment, an Information Handling System (IHS) includes a processing system; a memory system that is coupled to the processing system; and at least one cable connector sensor device that is coupled to the processing system and configured to: detect that a cable connector is inserted in a port defined by a port system that is coupled to the processing system while the cable connector does not mate with a networking device connector that is included in the port system; and transmit, to the processing system in response to identifying that the cable connector is not mated with the networking device connector included in the port system when the cable connector is inserted in the port defined by the port system, an incorrect connection signal that indicates that the cable connector is incorrectly connected to the port system.

BRIEF DESCRIPTION OF THE DRAWINGS

FIG. 7 is a schematic view illustrating a connector connection verification reporting screen that may be provided on a management device during the method of FIG. 4.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
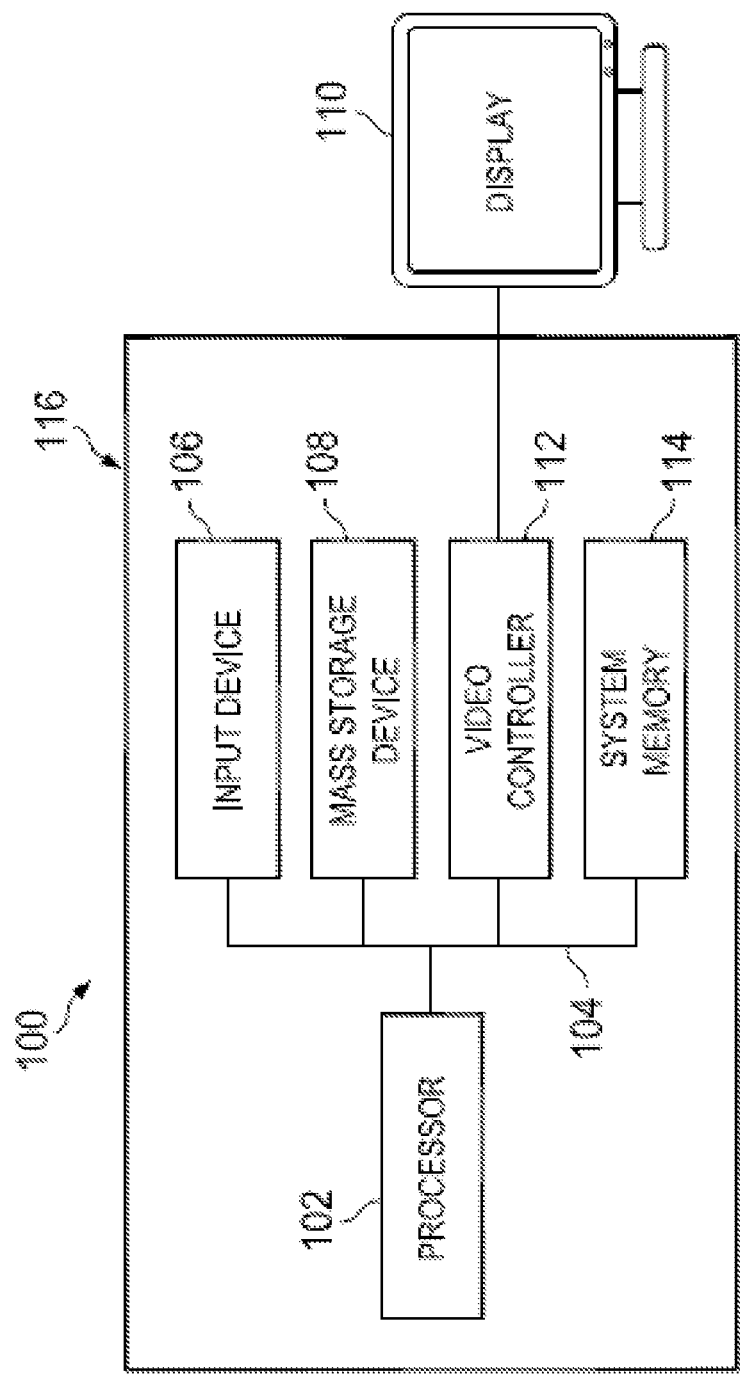
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
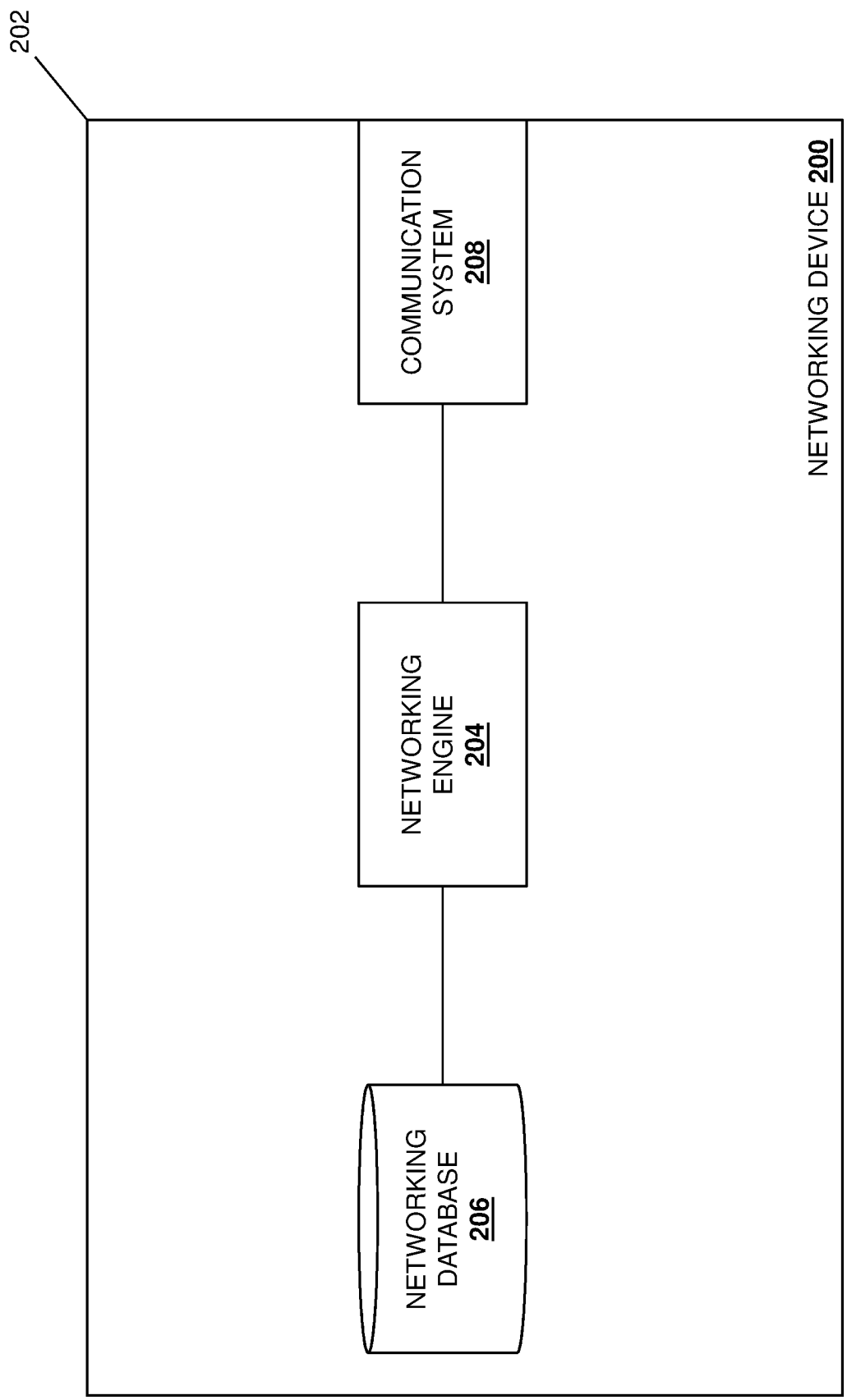
FIG. 2A is a schematic view illustrating an embodiment of a networking device that may utilize the connector connection verification system of the present disclosure.
Figure 2B:
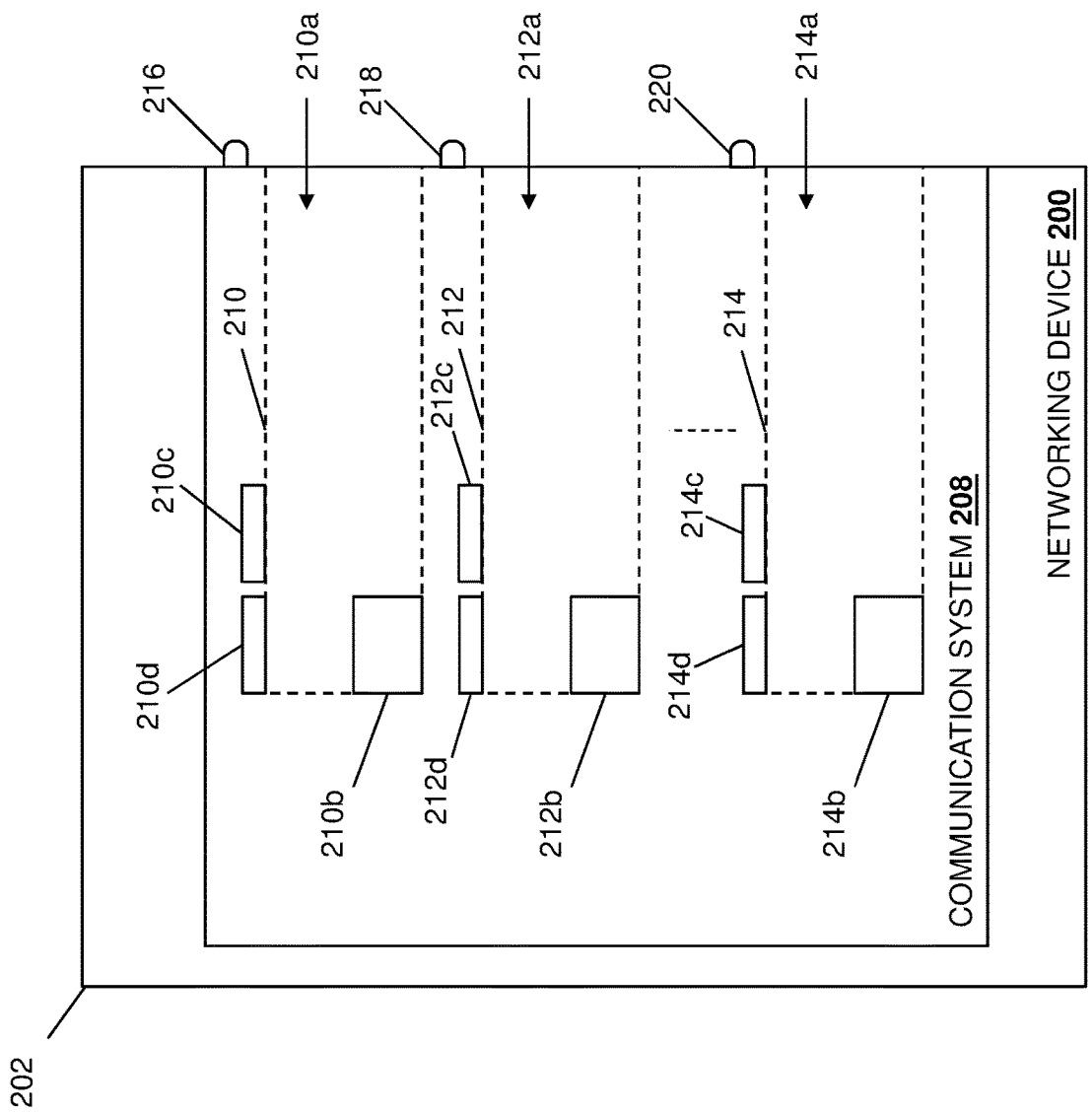
FIG. 2B is a schematic view illustrating an embodiment of a communication system on the networking device of FIG. 2A.

Referring now to FIGS. 2A and 2B, an embodiment of a networking device 200 is illustrated that may utilize the connector connection verification system of the present disclosure. In an embodiment, the networking device 200 may be provided by the IHS 100 discussed above with reference to FIG. 1 and/or may include some or all of the components of the IHS 100, and in the specific examples below is provided by a switch device. Furthermore, while illustrated and discussed as being provided by switch devices and/or other networking devices, one of skill in the art in possession of the present disclosure will recognize that the functionality of the networking device 200 discussed below may be provided by other devices (e.g., server devices, storage systems, and/or other computing devices) that are configured to operate similarly as the networking device 200 discussed below.

In the illustrated embodiment, the networking device 200 includes a chassis 202 that houses the components of the networking device 200, only some of which are illustrated below. For example, the chassis 202 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a networking engine 204 that is configured to perform the functionality of the networking engines and/or networking devices discussed below. However, while one of skill in the art in possession of the present disclosure will recognize that the networking engine 204 is described below as providing Command Line Interface (CLI) functionality and visual indicator device/LED controller functionality, the networking engine 204 may perform a variety of other functionality while remaining within the scope of the present disclosure as well.

The chassis 202 may also house a storage system (not illustrated, but which may include the storage 108 discussed above with reference to FIG. 1) that is coupled to the networking engine 204 (e.g., via a coupling between the storage system and the processing system) and that includes a networking database 206 that is configured to store any of the information utilized by the networking engine 204 discussed below. The chassis 202 may also house a communication system 208 that is coupled to the networking engine 204 (e.g., via a coupling between the communication system 308 and the processing system) and that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure.

With reference to FIG. 2B, an embodiment of the communication system 208 in the networking device 200 is illustrated in more detail. In the illustrated embodiment, the communication system includes a plurality of port systems 210, 212, and up to 214 (illustrated in dashed lines in FIG. 2B) that are each coupled to the networking engine 204. As discussed in further detail below, each port system on the networking device 200 may define a port that is configured to accept a cable connector, may include a networking device connector that is located opposite the entrance to that port and that is coupled to the networking engine 204 such that it is configured to mate with a cable connector to couple that cable connector and cabling to the networking engine 204, and may include one or more cable connector sensor devices that may be coupled to the networking engine 204 and located adjacent that port system. However, while some specific components of each port system 210-214 are illustrated and described below, one of skill in the art in possession of the present disclosure will appreciate that the port systems 210-214 may include additional and/or different components as well for providing conventional port system functionality, as well as the functionality discussed below, while remaining within the scope of the present disclosure. In the embodiments illustrated and described below, one or more visual indicator devices (e.g., Light Emitting Devices (LEDs) in the examples below) are provided on the chassis 202 adjacent each port system, with visual indicator device(s) 216 located adjacent the port system 210, visual indicator device(s) 218 located adjacent the port system 212, and visual indicator device(s) 220 located adjacent the port system 214.

For example, in the embodiments illustrated and described below, the port system 210 defines a port 210a that is configured to accept a cable connector, includes a networking device connector 210b that is located opposite the entrance to that port 210a and that is coupled to the networking engine 204 such that it is configured to mate with a cable connector to couple that cable connector and cabling to the networking engine 204, includes a cable connector incorrect orientation sensor device 210c and a cable connector incorrect seating sensor device 210d that are configured to detect when a cable connector is inserted in the port 210a in an incorrect orientation, or when a cable connector is incorrectly seated in the port 210a such that it is not mated with the connector 210b properly. However, while two cable connector sensor devices 210c and 210d are illustrated and described, one of skill in the art in possession of the present disclosure will recognize that the functionality of the cable connector incorrect orientation sensor device 210c and the cable connector incorrect seating sensor device 210d may be provided by a single cable connector sensor device, and/or additional cable connector sensor devices may be utilized to detect incorrect connections of the cable connector to the connector 210b other than incorrect orientation or incorrect seating.

Similarly, in the embodiments illustrated and described below, the port system 212 defines a port 212a that is configured to accept a cable connector, includes a networking device connector 212b that is located opposite the entrance to that port 212a and that is coupled to the networking engine 204 such that it is configured to mate with a cable connector to couple that cable connector and cabling to the networking engine 204, includes a cable connector incorrect orientation sensor device 212c and a cable connector incorrect seating sensor device 212d that are configured to detect when a cable connector is inserted in the port 212a in an incorrect orientation, or when a cable connector is incorrectly seated in the port 212a such that it is not mated with the connector 212b properly. However, while two cable connector sensor devices 212c and 212d are illustrated and described, one of skill in the art in possession of the present disclosure will recognize that the functionality of the cable connector incorrect orientation sensor device 212c and the cable connector incorrect seating sensor device 212d may be provided by a single cable connector sensor device, and/or additional cable connector sensor devices may be utilized to detect incorrect connections of the cable connector to the connector 212b other than incorrect orientation or incorrect seating.

Similarly, in the embodiments illustrated and described below, the port system 214 defines a port 214a that is configured to accept a cable connector, includes a networking device connector 214b that is located opposite the entrance to that port 214a and that is coupled to the networking engine 204 such that it is configured to mate with a cable connector to couple that cable connector and cabling to the networking engine 204, includes a cable connector incorrect orientation sensor device 214c and a cable connector incorrect seating sensor device 214d that are configured to detect when a cable connector is inserted in the port 214a in an incorrect orientation, or when a cable connector is incorrectly seated in the port 214a such that it is not mated with the connector 214b properly. However, while two cable connector sensor devices 214c and 214d are illustrated and described, one of skill in the art in possession of the present disclosure will recognize that the functionality of the cable connector incorrect orientation sensor device 214c and the cable connector incorrect seating sensor device 214d may be provided by a single cable connector sensor device, and/or additional cable connector sensor devices may be utilized to detect incorrect connections of the cable connector to the connector 214b other than incorrect orientation or incorrect seating. However, while a specific networking device 200 has been illustrated and described, one of skill in the art in possession of the present disclosure will recognize that networking devices (or other devices operating according to the teachings of the present disclosure in a manner similar to that described below for the networking device 200) may include a variety of components and/or component configurations for providing conventional networking device functionality, as well as the functionality discussed below, while remaining within the scope of the present disclosure as well.

Figure 3:
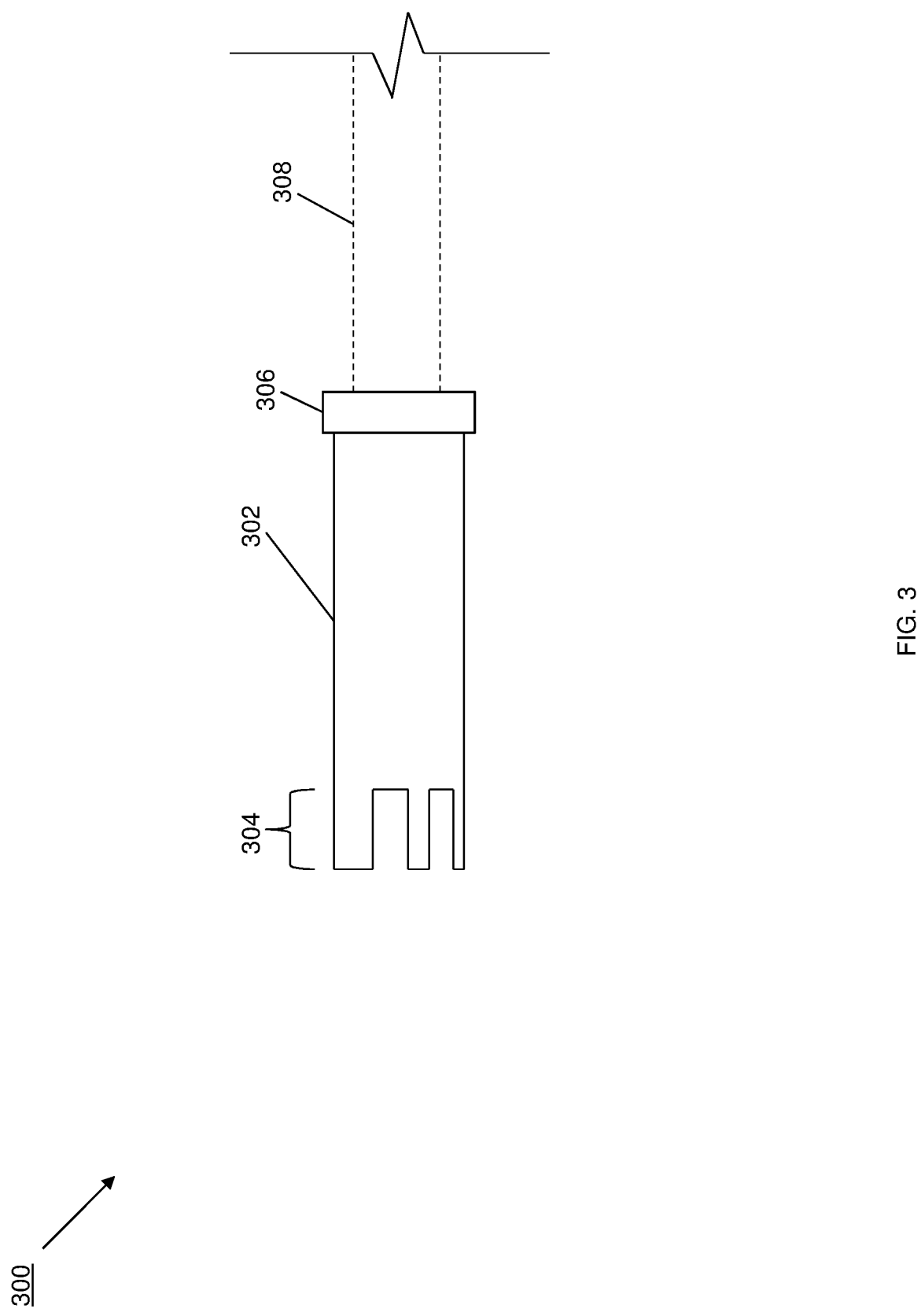
FIG. 3 is a schematic view illustrating an embodiment of a cable connector that may connected to the communication system of FIG. 2B.

Referring now to FIG. 3, an embodiment of a cable connector 300 is illustrated. In the illustrated embodiment, the cable connector 300 includes a base 302 that houses the components of the cable connector 300. A connector member 304 is included on a first end of the base 302, and may include any of a variety of connector components that would be apparent to one of skill in the art in possession of the present disclosure. The base 302 also includes a second end 306 that is opposite the base 302 from the first end and the connector member 304. In some of the examples below, the cable connector 300 is provided by a transceiver device, and thus the base 302 may define a transceiver device port that extends into the base 302, with the second end 306 defining a transceiver device port entrance. As will be appreciated by one of skill in the art in possession of the present disclosure, when the cable connector 300 is provided by a transceiver device, the transceiver device port entrance may be configured to allow a cable 308 to be connected to the transceiver device by moving a connector on that cable 308 through the transceiver device port entrance and into the transceiver device port such that it engages connection features house in the base 302 in order to connect the cable 308 to the transceiver device.

However, in other examples discussed below, the cable connector 300 is provided by a direct-attach cable connector that is integrated with a direct-attach cable that may be provided by a passive DAC cable, an active DAC cable, an AOC, and/or other direct-attach cables known in the art. As such, the base 302 and its components may be integrated on the cable 308 illustrated in FIG. 3 in any of a variety of manners. However, while transceiver devices and direct-attach cable connectors on direct-attach cables are described in the specific examples provided herein, one of skill in the art in possession of the present disclosure will appreciate how the connector connection verification system of the present disclosure may be utilized with a variety of cable connectors, cables, and/or other computing device/connected device couplings while remaining within the scope of the present disclosure as well. As such, the cable connector 300 may be modified in a variety of manners to provide different types of connectors whose connections to a computing device may be verified as described below while remaining within the scope of the present disclosure as well.

Figure 4:
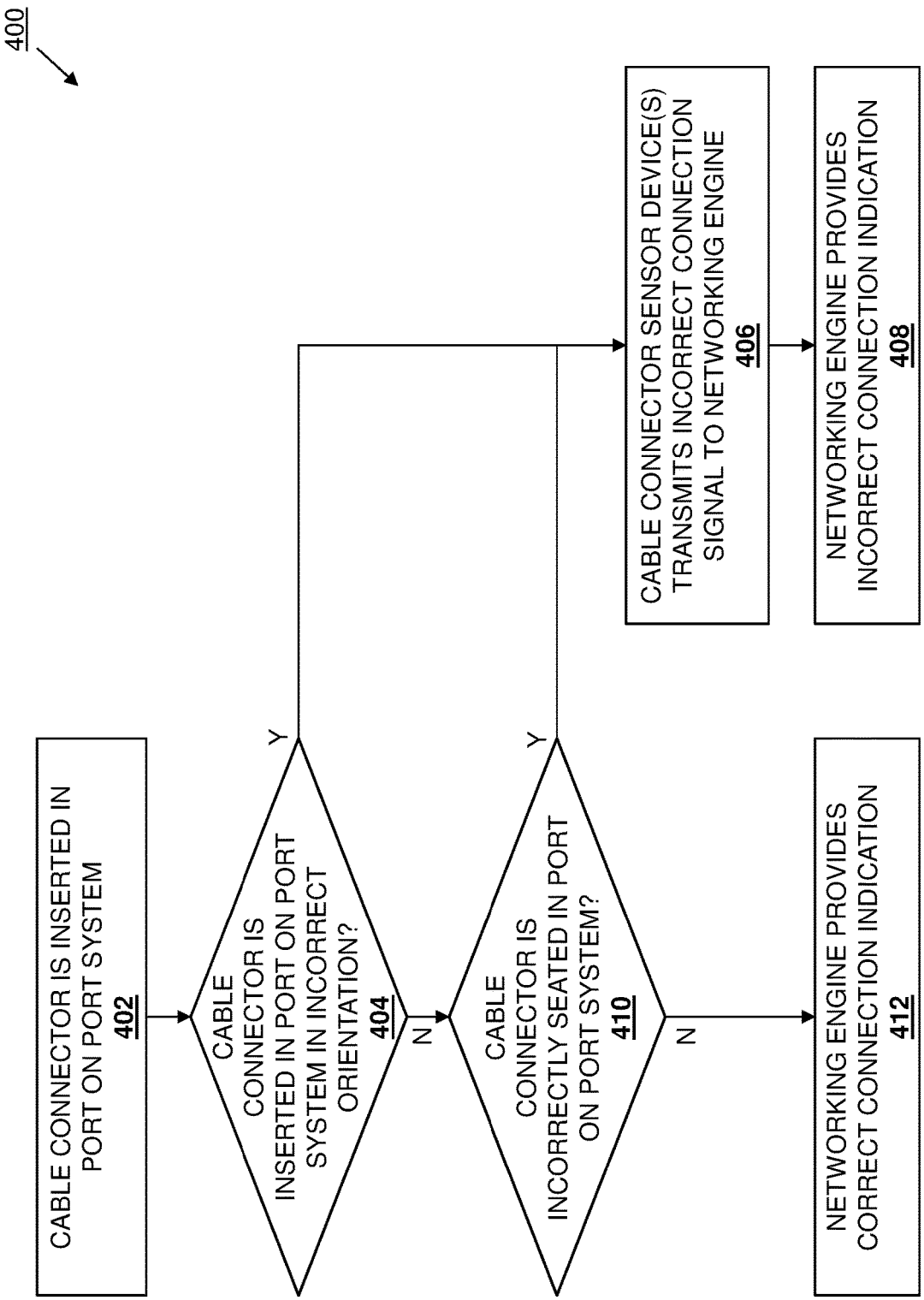
FIG. 4 is a flow chart illustrating an embodiment of a method for verifying the connection of a cable connector.

Referring now to FIG. 4, an embodiment of a method 400 for verifying the connection of a cable connector is illustrated. As discussed below, the systems and methods of the present disclosure provide for the detection of when a cable connector is inserted in but incorrectly connected to a port, along with an indication of that incorrect connection to allow the issue to be quickly diagnosed and corrected. For example, the connector connection verification system of the present disclosure may include a cable connector and a networking device. The networking device includes a port system defining a port and including a networking device connector, and at least one cable connector sensor device that is located adjacent the port. The cable connector sensor device(s) detects that the cable connector is inserted in the port defined by the port system while the cable connector does not mate with the networking device connector included in the port system and, in response, transmits an incorrect connection signal that indicates that the cable connector is incorrectly connected to the port system. A management interface provided on the networking device may receive the incorrect connection signal from the cable connector sensor device(s), and provide information that describes the cable connector and that indicates that the cable connector is incorrectly connected to the port system for display on a display device. As such, the incorrect connection of a cable connector to a port may be quickly and remotely identified, and issues associated with conventional systems such as data loss, network traffic disruption, network downtime, support calls, time-consuming troubleshooting operations, discarded cable connectors/cabling, and the purchasing of new cable connectors/cabling are eliminated.

Figure 5A:
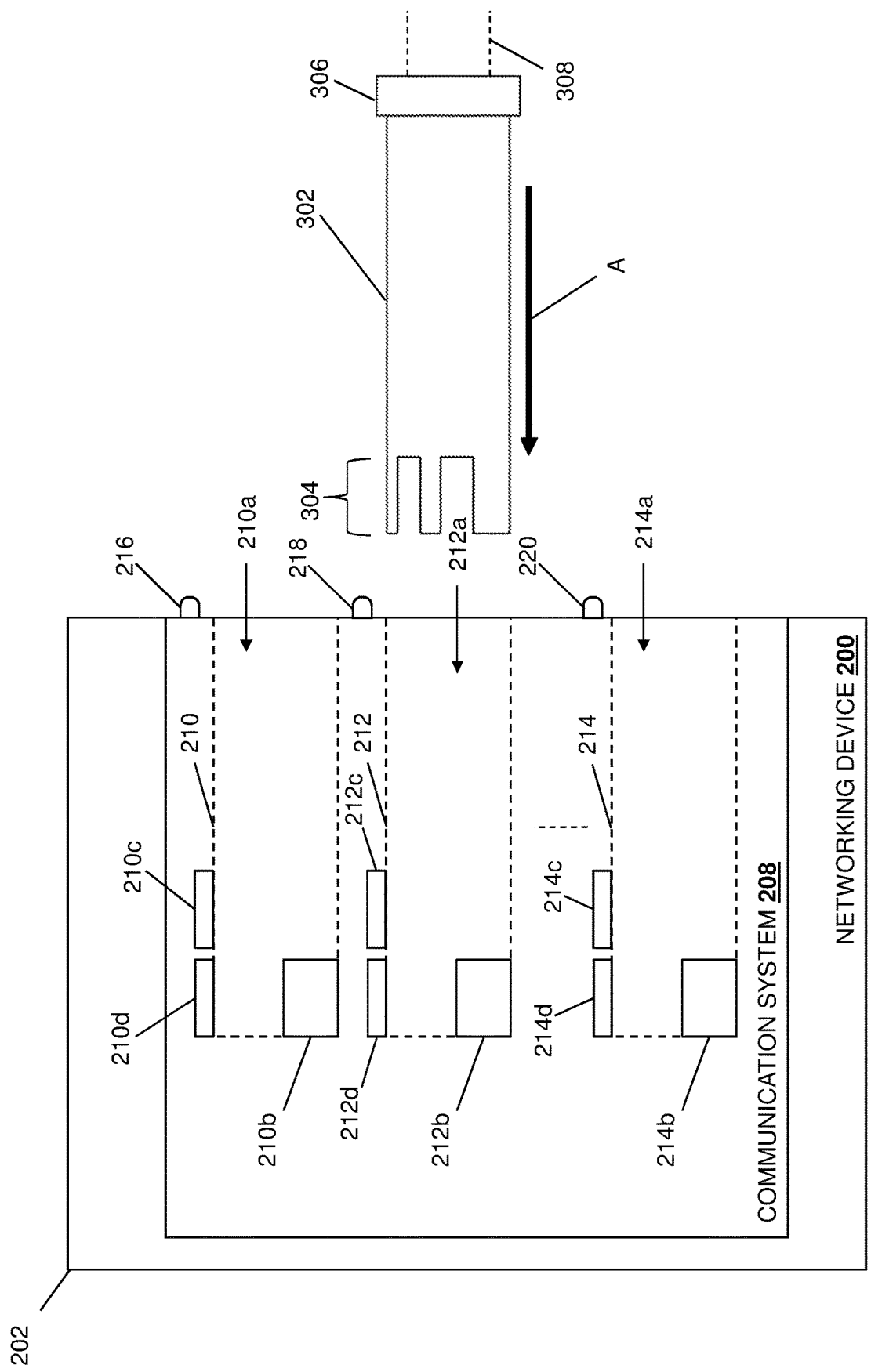
FIG. 5A is a schematic view illustrating an embodiment of the cable connector of FIG. 3 being connected to the communication system of FIG. 2B on the networking device of FIG. 2A during the method of FIG. 4 in an incorrect orientation.

The method 400 begins at block 402 where a cable connector is inserted in a port on a port system. With reference to FIG. 5A, in an embodiment of block 402, the cable connector 300 may be positioned adjacent the port 212a on the port system 212 such that the connector member 304 on the base 302 is positioned immediately adjacent the entrance to the port 212a. As will be appreciated by one of skill in the art in possession of the present disclosure, in the example illustrated in FIGS. 5A and 5B, the cable connector 300 is oriented in an "upside down" or otherwise incorrect orientation such that the connector member 304 on the base 302 is not properly aligned with the networking device connector 212b in the port system 212 and thus will not properly mate with the networking device connector 212b in the port system 212 when inserted in the port 212a. For example, the port systems on many networking devices require cable connectors to be oriented in a particular orientation (e.g., "rightside up") when inserted in a port in order to provide for proper engagement of a connector member on that cable connector and a networking device connector in that port system, and a common issue with cable connector/port insertion is the insertion of the cable connector into a port in the "upside down" or incorrect orientation illustrated in FIGS. 5A and 5B.

Figure 5B:
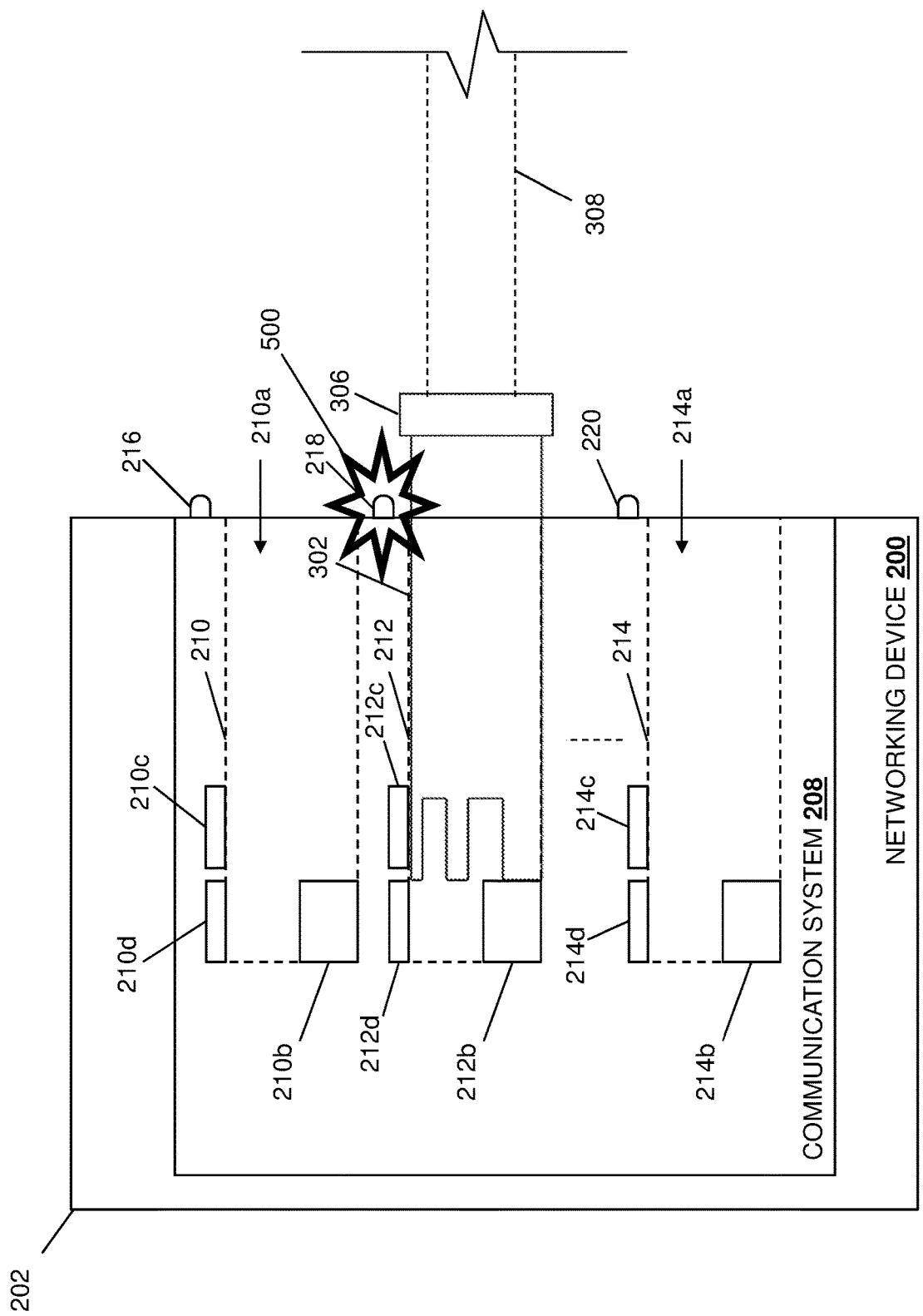
FIG. 5B is a schematic view illustrating an embodiment of the cable connector of FIG. 3 connected to the communication system of FIG. 2B on the networking device of FIG. 2A during the method of FIG. 4 in an incorrect orientation.

As such, when the cable connector 300 is then moved in a direction A through the port 212a and towards the networking device connector 212b included in the port system 212, the connector member 304 on the base 302 will engage the networking device connector 212b and/or other features in the port system 212 (as illustrated in FIG. 5B) without properly mating with the networking device connector 212b in a manner that would allow the cable connector to transmit data with the networking engine 204 in the networking device 200 due to the incorrect orientation of the cable connector 300 (i.e., due to the cable connector 300 having been inserted in the port 212a "upside down"). Furthermore, while the cable connector 300 is illustrated and described as being inserted into the port 212a on the port system 212 in the incorrect orientation in FIGS. 5A and 5B, one of skill in the art in possession of the present disclosure will appreciate that the cable connector 300 may be inserted into the ports 210a or 214a on the port systems 210 or 214, respectively, in the incorrect orientation similarly as described above.

Figure 6A:
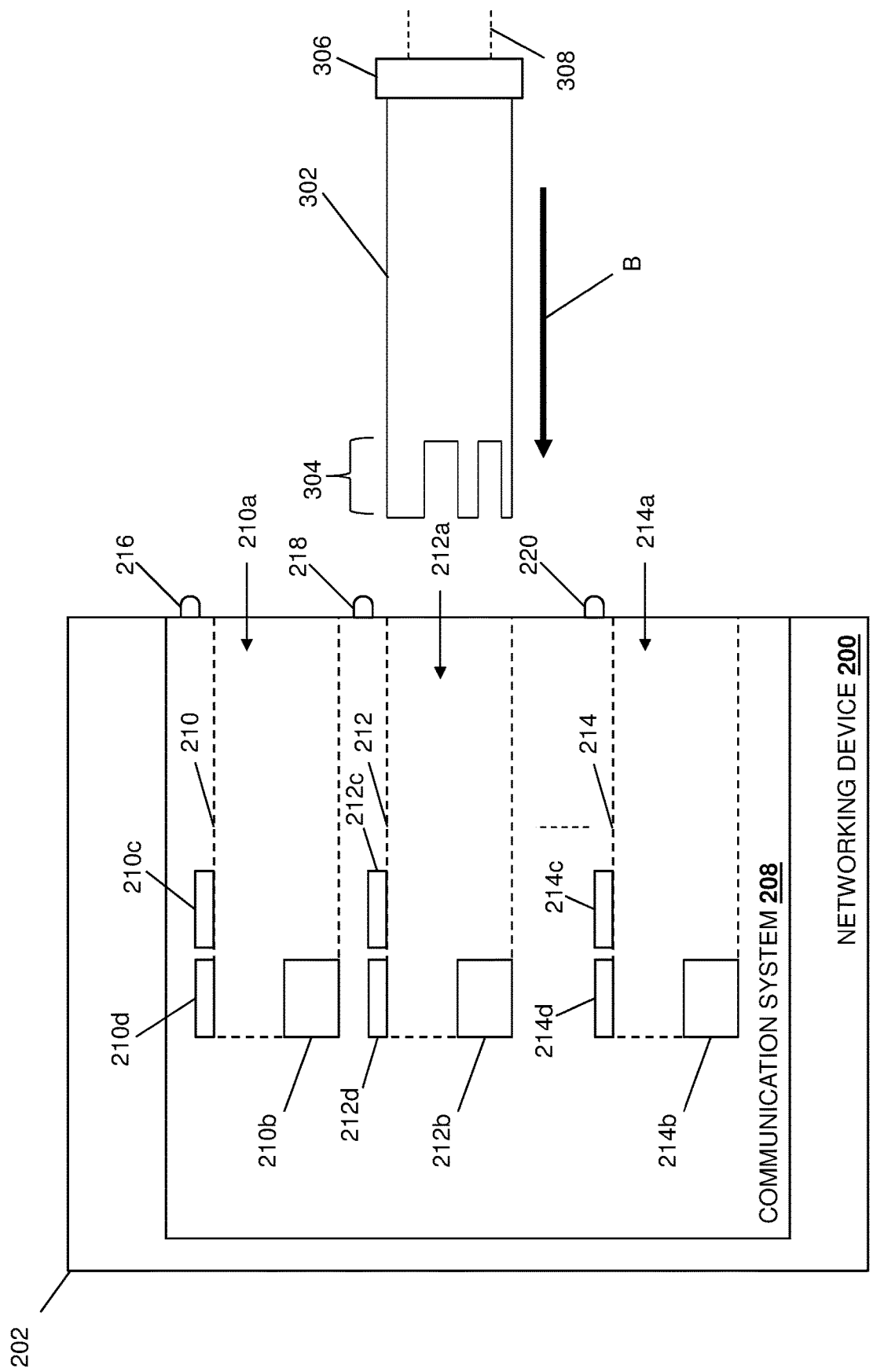
FIG. 6A is a schematic view illustrating an embodiment of the cable connector of FIG. 3 being connected to the communication system of FIG. 2B on the networking device of FIG. 2A during the method of FIG. 4.
Figure 6B:
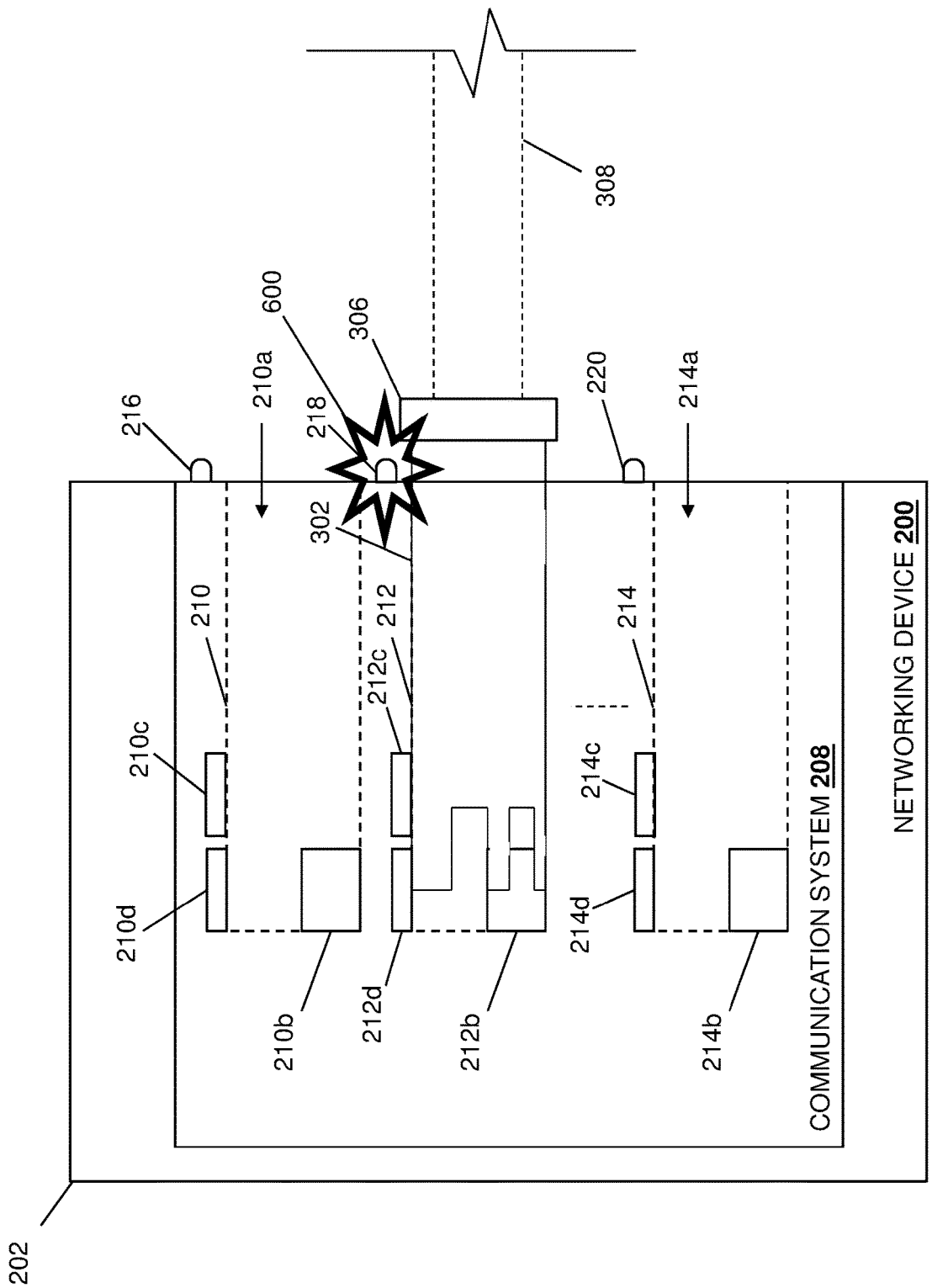
FIG. 6B is a schematic view illustrating an embodiment of the cable connector of FIG. 3 incorrectly connected to the communication system of FIG. 2B on the networking device of FIG. 2A during the method of FIG. 4.

With reference to FIG. 6A, in an embodiment of block 402, the cable connector 300 may be positioned adjacent the port 212a on the port system 212 such that the connector member 304 on the base 302 is positioned immediately adjacent the entrance to the port 212a. As will be appreciated by one of skill in the art in possession of the present disclosure, in the example illustrated in FIGS. 6A and 6B, the cable connector 300 is oriented in the "rightside up" or otherwise correct orientation discussed above such that the connector member 304 on the base 302 is properly aligned with the networking device connector 212b in the port system 212 and thus may properly mate with the networking device connector 212b in the port system 212 when inserted in the port 212a. However, as illustrated in FIG. 6B, the movement of the cable connector 300 in a direction B through the port 212a and towards the networking device connector 212b included in the port system 212 may be performed such that the cable connector 300 is not fully inserted into the port 212a in a manner that does not provide for the mating (or otherwise full engagement of) the connector member 304 on the base 302 and the networking device connector 212b in the port system 212 in a manner that would allow the cable connector to transmit data with the networking engine 204 in the networking device 200, and a common issue with cable connector/port insertion is the insertion of the cable connector into a port such that it is "unseated" or otherwise incorrectly connected as illustrated in FIG. 6B. Furthermore, while the cable connector 300 is illustrated and described as being "unseated" in the port 212a on the port system 212 in FIGS. 6A and 6B, one of skill in the art in possession of the present disclosure will appreciate that the cable connector 300 may be "unseated" in the ports 210a or 214a on the port systems 210 or 214, respectively, similarly as described above.

The method 400 then proceeds to decision block 404 where it is determined whether the cable connector is inserted in the port on the port system in an incorrect orientation. With reference to FIG. 5B, in an embodiment of decision block 404, the cable connector incorrect orientation sensor device 212c and the cable connector incorrect seating sensor device 212d may be configured to detect when the cable connector 300 has been inserted into the port 212a on the port system 212 "upside down" or otherwise in the incorrect orientation illustrated in FIGS. 5A and 5B. In a specific example, the cable connector incorrect orientation sensor device 212c and the cable connector incorrect seating sensor device 212d may each be provided by proximity sensors that are configured to detect when the cable connector 300 is located immediately adjacent them, and thus when the cable connector 300 is inserted into the port 212a on the port system 212 "upside down" or otherwise in the incorrect orientation illustrated in FIG. 5B, the cable connector incorrect orientation sensor device 212c will detect the cable connector 300 (e.g., because the connector member 304 on the base 302 is located immediately adjacent or otherwise proximate the cable connector incorrect orientation sensor device 212c), while the cable connector incorrect seating sensor device 212d will not detect the cable connector 300 (e.g., because no portion of cable connector 300 is located immediately adjacent or otherwise proximate the cable connector incorrect seating sensor device 212d).

With reference to FIG. 6B, in an embodiment of decision block 404, the cable connector incorrect orientation sensor device 212c and the cable connector incorrect seating sensor device 212d may be configured to detect when the cable connector 300 has been inserted into the port 212a on the port system 212 in a manner that provides the cable connector 300 "unseated" or otherwise incorrectly connected to the port 212a such that the connector member on the base 302 does not mate (or otherwise fully engage) the networking device connector 212b as illustrated in FIG. 6B. Continuing with the specific example provided above where the cable connector incorrect orientation sensor device 212c and the cable connector incorrect seating sensor device 212d are each provided by proximity sensors that are configured to detect when the cable connector 300 is located immediately adjacent them, when the cable connector 300 is inserted into the port 212a on the port system 212 "rightside up" or otherwise in the correct orientation while also being "unseated" or otherwise incorrectly connected to the port 212a as illustrated in FIG. 6B, the cable connector incorrect orientation sensor device 212c will detect the cable connector 300 (e.g., because the connector member 304 on the base 302 is located immediately adjacent or otherwise proximate the cable connector incorrect orientation sensor device 212c), and the cable connector incorrect seating sensor device 212d will detect the cable connector 300 as well (e.g., because the connector member 304 on the base 302 is located immediately adjacent or otherwise proximate the cable connector incorrect seating sensor device 212d).

As such, at decision block 404, the determination of whether the cable connector 300 is inserted in the port 212a on the port system 212 in an incorrect orientation may be made based on whether the cable connector 300 is detected by the cable connector incorrect orientation sensor device 212c and not detected by the cable connector incorrect seating sensor device 212d. In a simplified example, the cable connector incorrect orientation sensor device 212c may be configured to assert a signal (e.g., a "1") when it detects the cable connector 300, while the cable connector incorrect seating sensor device 212d may be configured to not assert a signal (e.g., a "0") when it does not detect the cable connector 300, and thus the cable connector 300 may be determined to have been inserted in the port 212a on the port system 212 in the incorrect orientation when the cable connector incorrect orientation sensor device 212c asserts a signal and the cable connector incorrect seating sensor device 212d does not assert a signal.

Similarly, at decision block 404, the cable connector 300 may be determined to have been inserted in the port 212a on the port system 212 in the correct orientation when the cable connector incorrect orientation sensor device 212c asserts a signal and the cable connector incorrect seating sensor device 212d asserts a signal. However, while particular types of cable connector sensor devices detecting the cable connector 300 using particular detection techniques has been described, one of skill in the art in possession of the present disclosure will appreciate that the cable connector sensor device(s) of the present disclosure may detect the incorrect orientation of the cable connector 300 in other manners that will fall within the scope of the present disclosure as well.

If, at decision block 404, it is determined that the cable connector is inserted in the port on the port system in an incorrect orientation, the method 400 proceeds to block 406 where cable connector sensor device(s) transmit an incorrect connection signal to a networking engine. As discussed above, in an embodiment of block 406 and in response to the cable connector 300 having been inserted into the port 212a on the port system 212 "upside down" or otherwise in an incorrect orientation, the cable connector incorrect orientation sensor device 212c and the cable connector incorrect seating sensor device 212d may transmit an incorrect connection signal to the networking engine 204 in the networking device 200. Continuing with the specific example provided above, at block 406 the incorrect connection signal may be transmitted to the networking engine 204 in the networking device 200 in response to the cable connector incorrect orientation sensor device 212c asserting a signal (e.g., a "1") and the cable connector incorrect seating sensor device 212d not asserting a signal (e.g., a "0"), which may be interpreted by the networking engine 204 as an indication that the cable connector 300 has been inserted into the port 212a on the port system 212 "upside down" or otherwise in an incorrect orientation. However, as discussed above, incorrect connection signals may be provided to the networking engine 204 in the networking device 200 in a variety of manners that one of skill in the art in possession of the present disclosure will recognize as indicated that the cable connector 300 has been inserted into the port 212a on the port system 212 "upside down" or otherwise in an incorrect orientation.

The method 400 then proceeds to block 408 where the networking engine provides an incorrect connection indication. In an embodiment, at block 408 and in response to receiving the incorrect connection signal that indicates that the cable connector 300 having been inserted into the port 212a on the port system 212 "upside down" or otherwise in an incorrect orientation, the networking engine 204 in the networking device 200 may provide an incorrect connection indication via a Command Line Interface (CLI) provided for the networking device 200. For example, FIG. 7 illustrates a management device 700 that may be provided by the IHS 100 discussed above with reference to FIG. 1 and/or may include some or all of the components of the IHS 100, and in specific examples may be provided by a desktop computing device, a laptop/notebook computing device, a tablet computing device, a mobile phone, and/or other management devices that would be apparent to one of skill in the art in possession of the present disclosure. In the illustrated embodiment, the management device 700 includes a display device 702 displaying a management screen 704 that may be provided by the CLI provided for the networking device 200 (e.g., via remote access of the networking device 200 by the management device 700).

In the example illustrated in FIG. 7, the management screen 704 identifies node/slot/port information (e.g., 1/1/1 to 1/1/52) that may identify each port system on the networking device 200, information about that port system (e.g., form-factor information), information about the cable connector provided in that port system (e.g., media information, serial number information, and qualification information), and seating information for the cable connector provided in that port system. As such, in this specific example, the management screen 704 indicates that the port systems that include ports 1-50 on the networking device 200 have been provided with cable connectors that are correctly connected to those ports (e.g., as indicated by the "SFP+" form-factor ports 1-50 that have "SFP+10BASE-SR" cable connectors that have been qualified and are indicated as properly seated (e.g., "YES") in those ports).

Furthermore, the management screen 704 has also provided incorrect connection indications for the port systems that include ports 51 and 52 on the networking device 200 that have been provided with cable connectors that are incorrectly connected to those ports (e.g., as indicated by the "CONNECTION ERROR" and "NO" in the "seated" column). As such, one of skill in the art in possession of the present disclosure will appreciate that the incorrect connection indication illustrated as having been provided for either of the port systems that include ports 51 and 52 in FIG. 7 may be provided for the port system 212 when the cable connector 300 has been inserted into the port 212a on the port system 212 "upside down" or otherwise in an incorrect orientation as discussed above. However, while a specific incorrect connection indication has been described as being provided in a CLI provided for a networking device, one of skill in the art in possession of the present disclosure will appreciate how different incorrect connection indications may be provided on different interfaces (e.g., Graphical User Interfaces (GUIs) and/or other management interfaces known in the art) while remaining within the scope of the present disclosure as well. For example, while not illustrated in FIG. 7, the incorrect connection indication may identify the incorrect orientation of a cable connector when that incorrect orientation has been detected by the cable connection sensor device(s).

With reference back to FIG. 5B, in another embodiment of block 408 and in response to receiving the incorrect connection signal that indicates that the cable connector 300 has been inserted into the port 212a on the port system 212 "upside down" or otherwise in an incorrect orientation, the networking engine 204 in the networking device 200 may provide an incorrect connection indication that includes causing the visual indicator device(s) 218 adjacent the port system 212/entrance of the port 212a to provide a visual indication 500 to indicate that the cable connector 300 has been inserted into the port 212a on the port system 212 "upside down" or otherwise in an incorrect orientation. In a specific example, the visual indicator device(s) 218 may be provided by LEDs and may be illuminated blue and "blinked" to visually indicate that the cable connector 300 has been inserted into the port 212a on the port system 212 "upside down" or otherwise in an incorrect orientation, although one of skill in the art in possession of the present disclosure will appreciate that a variety of visual indications may be provided to indicate that the cable connector 300 has been inserted into the port 212a on the port system 212 "upside down" or otherwise in an incorrect orientation.

If at decision block 404, it is determined that the cable connector is inserted in the port on the port system in a correct orientation, the method 400 proceeds to decision block 410 where it is determined whether the cable connector is incorrectly seated in the port on the port system. In an embodiment, at decision block 410, the determination of whether the cable connector 300 is not properly "seated" or otherwise incorrectly connected to the port 212a on the port system 212 may be made based on whether the networking engine 204 in the networking device 200 is unable to detect the cable connector 300 via the networking device connector 212b while that cable connector 300 is being detected by the cable connector incorrect orientation sensor device 212c and by the cable connector incorrect seating sensor device 212d. As discussed above, the cable connector incorrect orientation sensor device 212c may be configured to assert a signal (e.g., a "1") when it detects the cable connector 300, while the cable connector incorrect seating sensor device 212d may be configured to assert a signal (e.g., a "1") when it detects the cable connector 300, and thus the cable connector 300 may be determined to be not properly "seated" or otherwise incorrectly connected the port 212a on the port system 212 when the networking engine 204 in the networking device 200 is unable to detect the cable connector 300 via the networking device connector 212b while the cable connector incorrect orientation sensor device 212c is asserting a signal and the cable connector incorrect seating sensor device 212d is asserting a signal.

Similarly, at decision block 410, the cable connector 300 may be determined to have been properly seated or otherwise correctly connected in the port 212a on the port system 212 when the networking engine 204 in the networking device 200 is able to detect the cable connector 300 via the networking device connector 212b (which one of skill in the art in possession of the present disclosure will recognize will cause the cable connector incorrect orientation sensor device 212c to assert a signal and the cable connector incorrect seating sensor device 212d to assert a signal). However, while particular types of cable connector sensor devices detecting the cable connector 300 have been described, one of skill in the art in possession of the present disclosure will appreciate that the cable connector sensor device(s) of the present disclosure may detect proper "seating" or otherwise correct connection of the cable connector 300 in other manners that will fall within the scope of the present disclosure as well.

If, at decision block 410, it is determined that the cable connector is incorrectly seated in the port on the port system, the method 400 proceeds to block 406 where a cable connector sensor device transmits an incorrect connection signal to a networking engine. Similarly as discussed above, in an embodiment of block 406 and in response to the cable connector 300 having been inserted into the port 212a on the port system 212 such that it is improperly "seated" or otherwise incorrectly connected, the cable connector incorrect orientation sensor device 212c and the cable connector incorrect seating sensor device 212d may transmit an incorrect connection signal to the networking engine 204 in the networking device 200. Continuing with the specific example provided above, at block 406 the incorrect connection signal may be transmitted to the networking engine 204 in the networking device 200 in response to the cable connector incorrect orientation sensor device 212c asserting a signal (e.g., a "1") and the cable connector incorrect seating sensor device 212d asserting a signal (e.g., a "1"), which may be interpreted by the networking engine 204 as an indication that the cable connector 300 is not properly "seated" or otherwise incorrectly connected to the port 212a on the port system 212 when the networking engine 204 is unable to detect the cable connector 300 via the networking device connector 212b. However, as discussed above, incorrect connection signals may be provided to the networking engine 204 in the networking device 200 in a variety of manners that one of skill in the art in possession of the present disclosure will recognize as indicated that the cable connector 300 has been improperly "seated" or otherwise incorrectly connected to the port 212*a* on the port system 212.

The method 400 then proceeds to block 408 where the networking engine provides an incorrect connection indication. Similarly as discussed above, at block 408 and in response to receiving the incorrect connection signal that indicates that the cable connector 300 has been improperly "seated" or otherwise incorrectly connected to the port 212*a* on the port system 212, the networking engine 204 in the networking device 200 may provide an incorrect connection indication via a CLI provided for the networking device 200. With reference back to the management device 700 of FIG. 7, one of skill in the art in possession of the present disclosure will appreciate that the incorrect connection indication provide for either of the port systems that include ports 51 and 52 in FIG. 7 may be provided for the port system 212 when the cable connector 300 has been improperly "seated" or otherwise incorrectly connected to the port 212*a* on the port system 212 as discussed above. However, while specific incorrect connection indications have been described as being provided in a CLI provided for a networking device, one of skill in the art in possession of the present disclosure will appreciate how different incorrect connection indications may be provided on different interfaces (e.g., Graphical User Interfaces (GUIs) and/or other management interfaces known in the art) while remaining within the scope of the present disclosure as well. For example, while not illustrated in FIG. 7, the incorrect connection indication may identify that cable connector is "unseated" when that has been detected by the cable connection sensor device(s).

With reference back to FIG. 6B, in another embodiment of block 408 and in response to receiving the incorrect connection signal that indicates that the cable connector 300 has been improperly "seated" or otherwise incorrectly connected to the port 212*a* on the port system 212, the networking engine 204 in the networking device 200 may provide an incorrect connection indication that includes causing the visual indicator device(s) 218 adjacent the port system 212/entrance of the port 212*a* to provide a visual indication 600 to indicate that the cable connector 300 has been improperly "seated" or otherwise incorrectly connected to the port 212*a* on the port system 212. In a specific example, the visual indicator device(s) 218 may be provided by LEDs and may be illuminated blue and "blinked" to visually indicate that the cable connector 300 has been improperly "seated" or otherwise incorrectly connected to the port 212*a* on the port system 212, although one of skill in the art in possession of the present disclosure will appreciate that a variety of visual indications may be provided to indicate that the cable connector 300 has been improperly "seated" or otherwise incorrectly connected to the port 212*a* on the port system 212. For example, while the visual indications 500 and 600 for incorrect orientation and improperly "seated" cable connectors has been described as being the same (e.g., "blinked" blue illumination), one of skill in the art in possession of the present disclosure will appreciate that those visual indications may be provided differently to distinguish those two different cable connector/port connection issues.

If, at decision block 410, it is determined that the cable connector is correctly seated in the port on the port system, the method 400 proceeds to block 412 where the networking engine provides a correct connection indication. As discussed above, at block 410 the cable connector 300 may be determined to have been properly seated or otherwise correctly connected in the port 212*a* on the port system 212 when the networking engine 204 in the networking device 200 is able to detect the cable connector 300 via the networking device connector 212*b* (which one of skill in the art in possession of the present disclosure will recognize will cause the cable connector incorrect orientation sensor device 212*c* to assert a signal and the cable connector incorrect seating sensor device 212*d* to assert a signal). For example, FIG. 8 illustrates how the cable connector 300 may be oriented correctly (e.g., "rightside up") and properly "seated" or otherwise correctly connected in the port 212*a* on the port system 212 such that the networking engine 204 in the networking device 200 is able to detect the cable connector 300 via the networking device connector 212*b*.

Similarly as discussed above, at block 412 and in response to determining that the cable connector 300 has been correctly connected to the port 212*a* on the port system 212, the networking engine 204 in the networking device 200 may provide an correct connection indication via the CLI provided for the networking device 200. With reference back to the management device 700 of FIG. 7, one of skill in the art in possession of the present disclosure will appreciate that the correct connection indication illustrated for any of the port systems that include ports 1-50 in FIG. 7 may be provided for the port system 212 when the cable connector 300 has been correctly connected to the port 212*a* on the port system 212 as discussed above. However, while specific correct connection indications have been described as being provided in a CLI provided for a networking device, one of skill in the art in possession of the present disclosure will appreciate how different correct connection indications may be provided on different interfaces (e.g., Graphical User Interfaces (GUIs) and/or other management interfaces known in the art) while remaining within the scope of the present disclosure as well.

Figure 8:
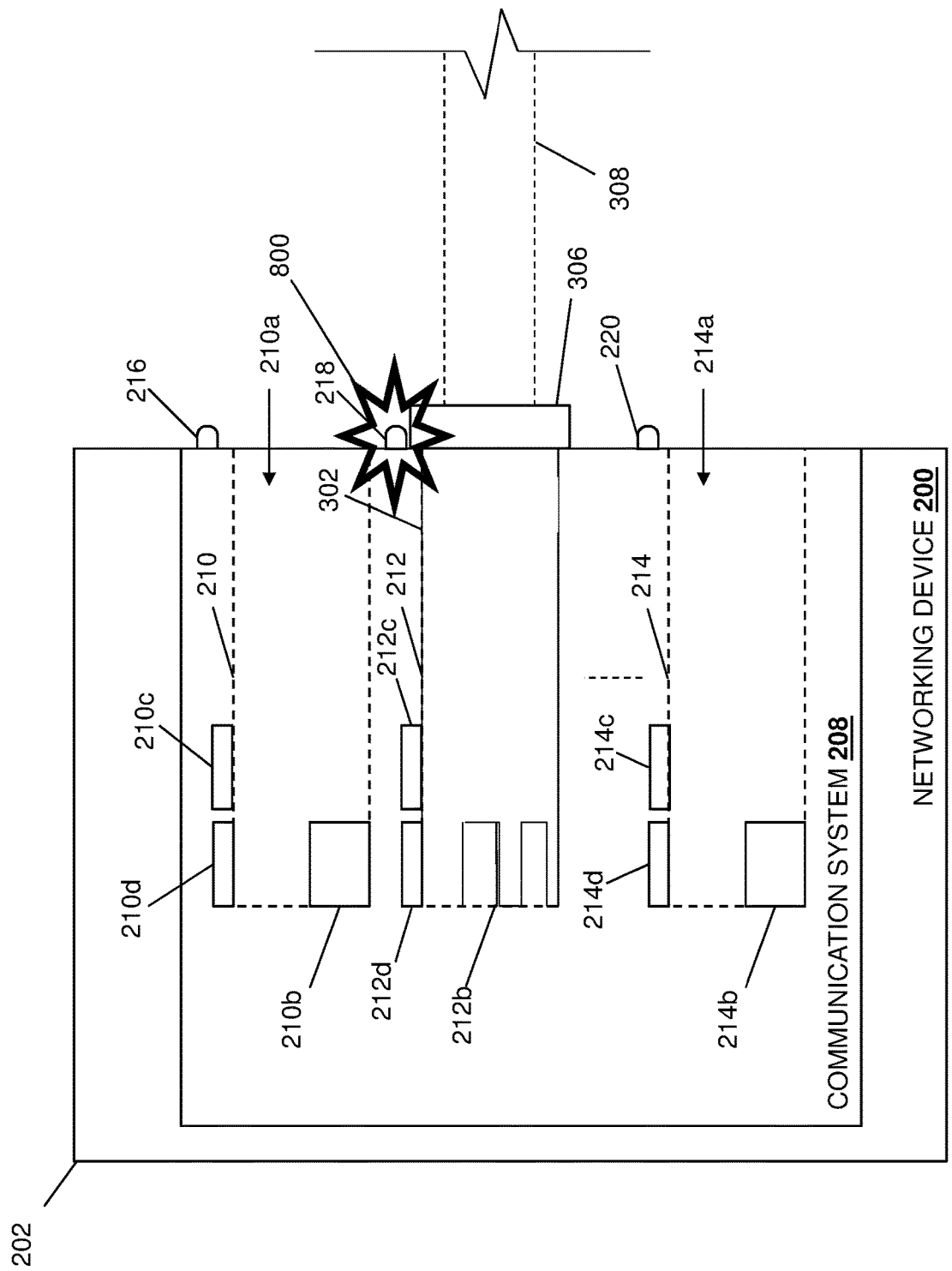
FIG. 8 is a schematic view illustrating an embodiment of the cable connector of FIG. 3 correctly connected to the communication system of FIG. 2B on the networking device of FIG. 2A during the method of FIG. 4.

As illustrated in FIG. 8, in an embodiment of block 412 and in response to determining that the cable connector 300 has been correctly connected to the port 212*a* on the port system 212, the networking engine 204 in the networking device 200 may provide a correct connection indication that includes causing the visual indicator device(s) 218 adjacent the port system 212/entrance of the port 212*a* to provide a visual indication 800 to indicate that the cable connector 300 has been correctly connected to the port 212*a* on the port system 212. In a specific example, the visual indicator device(s) 218 may be provided by LEDs and may be illuminated blue and "solid" (i.e., not "blinking") to visually indicate that the cable connector 300 has been correctly connected to the port 212*a* on the port system 212, although one of skill in the art in possession of the present disclosure will appreciate that a variety of visual indications may be provided to indicate that the cable connector 300 has been correctly connected to the port 212*a* on the port system 212.

Thus, systems and methods have been described that provide for the detection of when a cable connector is inserted in but incorrectly connected to a port, along with an indication of that incorrect connection to allow the issue to be quickly diagnosed and corrected. For example, the connector connection verification system of the present disclosure may include a cable connector and a switch device. The switch device includes a port system defining a port and including a switch device connector, and at least one cable connector sensor device that is located adjacent the port. The cable connector sensor device(s) detect that the cable connector is inserted in the port defined by the port system while the cable connector does not mate with the switch device connector included in the port system and, in response, transmit an incorrect connection signal that indicates that the cable connector is incorrectly connected to the port system. A management interface provided on the networking device may receive the incorrect connection signal from the cable connector sensor device(s), and provide information that describes the cable connector and that indicates that the cable connector is incorrectly connected to the port system for display on a display device. As such, the incorrect connection of a cable connector to a port may be quickly and remotely identified, and issues associated with conventional systems such as data loss, network traffic disruption, network downtime, support calls, time-consuming troubleshooting operations, discarded cable connectors/cabling, and the purchasing of new cable connectors/cabling are eliminated.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A connector connection verification system, comprising:
    a cable connector; and
    a networking device that includes:
        a port system defining a port and including a networking device connector; and
        at least one cable connector sensor device that is located adjacent the port, wherein the at least one cable connector sensor device is configured to:
            detect that the cable connector is inserted in the port defined by the port system while the cable connector does not mate with the networking device connector included in the port system; and
            transmit, in response to identifying that the cable connector is not mated with the networking device connector included in the port system when the cable connector is inserted in the port defined by the port system, an incorrect connection signal that indicates that the cable connector is incorrectly connected to the port system.

2. The system of claim 1, wherein at least one cable connector sensor device is configured to:
    detect that the cable connector is inserted in the port defined by the port system in a correct orientation while the cable connector does not mate with the networking device connector included in the port system.

3. The system of claim 1, wherein at least one cable connector sensor device is configured to:
    detect that the cable connector is inserted in the port defined by the port system in an incorrect orientation while the cable connector does not mate with the networking device connector included in the port system.

4. The system of claim 1, wherein the cable connector is provided by a transceiver device.

5. The system of claim 1, wherein the cable connector is included on the direct-attach cable.

6. The system of claim 1, further comprising:
    a management interface that is provided on the networking device and that is configured to:
        receive the incorrect connection signal from the at least one cable connector sensor device; and
        provide, for display on a display device, information that describes the cable connector and that indicates that the cable connector is incorrectly connected to the port system.

7. An Information Handling System (IHS), comprising:
    a processing system;
    a memory system that is coupled to the processing system; and
    at least one cable connector sensor device that is coupled to the processing system and configured to:
        detect that a cable connector is inserted in a port defined by a port system that is coupled to the processing system while the cable connector does not mate with a networking device connector that is included in the port system; and
        transmit, to the processing system in response to identifying that the cable connector is not mated with the networking device connector included in the port system when the cable connector is inserted in the port defined by the port system, an incorrect connection signal that indicates that the cable connector is incorrectly connected to the port system.

8. The IHS of claim 7, wherein at least one cable connector sensor device is configured to:
    detect that the cable connector is inserted in the port defined by the port system in a correct orientation while the cable connector does not mate with the networking device connector included in the port system.

9. The IHS of claim 7, wherein at least one cable connector sensor device is configured to:
    detect that the cable connector is inserted in the port defined by the port system in an incorrect orientation while the cable connector does not mate with the networking device connector included in the port system.

10. The IHS of claim 7, wherein the cable connector is provided by a transceiver device.

11. The IHS of claim 7, wherein the cable connector is included on the direct-attach cable.

12. The IHS of claim 7, wherein the memory system includes instructions that, when executed by the processing system, cause the processing system to provide a management interface that is configured to:
    receive the incorrect connection signal from the at least one cable connector sensor device; and
    provide, for display on a display device, information that describes the cable connector and that indicates that the cable connector is incorrectly connected to the port system.

13. The IHS of claim 7, wherein the memory system includes instructions that, when executed by the processing system, cause the processing system to:
    receive the incorrect connection signal from the at least one cable connector sensor device; and
    cause, in response to receiving the incorrect connection signal, at least one visual indicator device that is located adjacent the port system to provide a visual indication that indicates that the cable connector is incorrectly connected to the port system.

14. A method for verifying the connection of a cable connector, comprising:
    detecting, by at least one cable connector sensor device, that a cable connector is inserted in a port defined by a port system while the cable connector does not mate with a networking device connector that is included in the port system; and transmitting, by the at least one cable connector sensor device in response to identifying that the cable connector is not mated with the networking device connector included in the port system when the cable connector is inserted in the port defined by the port system, an incorrect connection signal that indicates that the cable connector is incorrectly connected to the port system.

15. The method of claim 14, further comprising:
detecting, by the at least one cable connector sensor device, that the cable connector is inserted in the port defined by the port system in a correct orientation while the cable connector does not mate with the networking device connector included in the port system.

16. The method of claim 14, further comprising:
detecting, by the at least one cable connector sensor device, that the cable connector is inserted in the port defined by the port system in an incorrect orientation while the cable connector does not mate with the networking device connector included in the port system.

17. The method of claim 14, wherein the cable connector is provided by a transceiver device.

18. The method of claim 14, wherein the cable connector is included on the direct-attach cable.

19. The method of claim 14, further comprising:
receiving, by a management interface from the at least one cable connector sensor device, the incorrect connection signal from the at least one cable connector sensor device; and
providing, by the management interface for display on a display device, information that describes the cable connector and that indicates that the cable connector is incorrectly connected to the port system.

20. The method of claim 14, further comprising:
receiving, by a management interface from the at least one cable connector sensor device, the incorrect connection signal from the at least one cable connector sensor device; and
causing, by the management interface in response to receiving the incorrect connection signal, at least one visual indicator device that is located adjacent the port system to provide a visual indication that indicates that the cable connector is incorrectly connected to the port system.

* * * * *